US012400882B2

(12) United States Patent
Sakurai (10) Patent No.: US 12,400,882 B2
(45) Date of Patent: Aug. 26, 2025

(54) SUBSTRATE PROCESSING APPARATUS AND SUBSTRATE PROCESSING METHOD (71) Applicant: TOKYO ELECTRON LIMITED, Tokyo (JP)

(72) Inventor: Hiroki Sakurai, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 518 days.

(21) Appl. No.: 17/878,132

(22) Filed: Aug. 1, 2022

(65) Prior Publication Data
US 2022/0375768 A1 Nov. 24, 2022

Related U.S. Application Data (62) Division of application No. 16/801,699, filed on Feb. 26, 2020, now Pat. No. 11,437,251.

(30) Foreign Application Priority Data

Feb. 26, 2019 (JP) .................. 2019-033189

(51) Int. Cl.
H01L 21/67 (2006.01)
B05B 1/02 (2006.01)
(Continued)

(52) U.S. Cl.
CPC ............ H01L 21/6708 (2013.01); B05B 1/02 (2013.01); B05B 1/14 (2013.01); B05B 7/24 (2013.01);
(Continued)

(58) Field of Classification Search
None
See application file for complete search history.

(56) References Cited

U.S. PATENT DOCUMENTS

2007/0289611 A1 12/2007 Hayashi
2016/0093517 A1* 3/2016 Higashi ............. H01L 21/67051
134/33

(Continued)

FOREIGN PATENT DOCUMENTS

CN 107871689 A 4/2018
JP 2003332297 A 11/2003
(Continued)

Primary Examiner — Roberts P Culbert
(74) Attorney, Agent, or Firm — Nath, Goldberg & Meyer; Jerald L. Meyer; Tanya E. Harkins (57) ABSTRACT A substrate processing apparatus includes: a substrate holder configured to hold a substrate; a processing liquid supply part configured to supply a processing liquid to the substrate held by the substrate holder; a chemical liquid supply part configured to supply a chemical liquid as a component of the processing liquid to the processing liquid supply part; a pure water supply part configured to supply pure water as a component of the processing liquid to the processing liquid supply part; a low-dielectric constant solvent supply part configured to supply a low-dielectric constant solvent as a component of the processing liquid to the processing liquid supply part; and a controller configured to control a ratio of the chemical liquid, the pure water, and the low-dielectric constant solvent contained in the processing liquid by controlling the chemical liquid supply part, the pure water supply part, the low-dielectric constant solvent supply part.

5 Claims, 6 Drawing Sheets (51) Int. Cl.
    *B05B 1/14*           (2006.01)
    *B05B 7/24*           (2006.01)
    *B05B 7/26*           (2006.01)
    *B05B 12/00*          (2018.01)
    *B05B 12/04*          (2006.01)
    *B05B 12/14*          (2006.01)
    *G05D 11/02*          (2006.01)
    *H01L 21/673*         (2006.01)
    *B08B 3/02*           (2006.01)
    *H01L 21/311*         (2006.01)

(52) U.S. Cl.
    CPC .............. *B05B 7/26* (2013.01); *B05B 12/004* (2013.01); *B05B 12/04* (2013.01); *B05B 12/1418* (2013.01); *G05D 11/02* (2013.01); *H01L 21/67017* (2013.01); *H01L 21/67023* (2013.01); *H01L 21/67051* (2013.01); *H01L 21/6715* (2013.01); *H01L 21/67346* (2013.01); *B08B 3/02* (2013.01); *H01L 21/31111* (2013.01)

(56) References Cited

U.S. PATENT DOCUMENTS

| | | |
|---|---|---|
| 2017/0256423 A1 | 9/2017 | Saito et al. |
| 2018/0033651 A1 | 2/2018 | Hayashi |
| 2019/0096721 A1 | 3/2019 | Iwasaki et al. |

FOREIGN PATENT DOCUMENTS

| | | |
|---|---|---|
| JP | 2004-179583 A | 6/2004 |
| JP | 2011124410 A | 6/2011 |
| JP | 2017163134 A | 9/2017 |
| KR | 10-2011-0066837 A | 6/2011 |
| KR | 10-2012-0100803 A | 9/2012 |
| KR | 10-2017-0104399 A | 9/2017 |

* cited by examiner

52 — 51
DIW
W

FIG. 6B

52 — 51
IPA — DIW
W

FIG. 6C

52 — 51
IPA
W

FIG. 6D

52 — 51
IPA — DHF
W

FIG. 6E

52 — 51
DHF
W

SUBSTRATE PROCESSING APPARATUS AND SUBSTRATE PROCESSING METHOD

CROSS-REFERENCE TO RELATED APPLICATION

This is a Divisional Application of U.S. patent application Ser. No. 16/801,699, filed Feb. 26, 2020, an application claiming benefit from Japanese Application No. 2019-033189, filed Feb. 26, 2019, the content of each of which is hereby incorporated by reference in its entirety.

TECHNICAL FIELD

The present disclosure relates to a substrate processing apparatus and a substrate processing method.

BACKGROUND

In manufacturing a semiconductor device, a plurality of different types of films are formed on a substrate. Wet etching is performed to give a pattern with respect to the plurality of films. Patent Document 1 discloses a technology for controlling a concentration and temperature of a hydrofluoric acid aqueous solution (DHF) in order to adjust an etching selectivity of a silicon nitride film (SiN) relative to a thermal silicon oxide film ($SiO_2$).

PRIOR ART DOCUMENT

Patent Document

Patent Document 1: Japanese Laid-Open Patent Publication No. 2004-179583

SUMMARY

According to an embodiment of the present disclosure, there is provided a substrate processing apparatus including: a substrate holder configured to hold a substrate; a processing liquid supply part configured to supply a processing liquid to the substrate held by the substrate holder; a chemical liquid supply part configured to supply a chemical liquid as a component of the processing liquid to the processing liquid supply part; a pure water supply part configured to supply pure water as a component of the processing liquid to the processing liquid supply part; a low-dielectric constant solvent supply part configured to supply a low-dielectric constant solvent as a component of the processing liquid to the processing liquid supply part; and a controller configured to control a ratio of the chemical liquid, the pure water, and the low-dielectric constant solvent contained in the processing liquid by controlling the chemical liquid supply part, the pure water supply part, the low-dielectric constant solvent supply part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
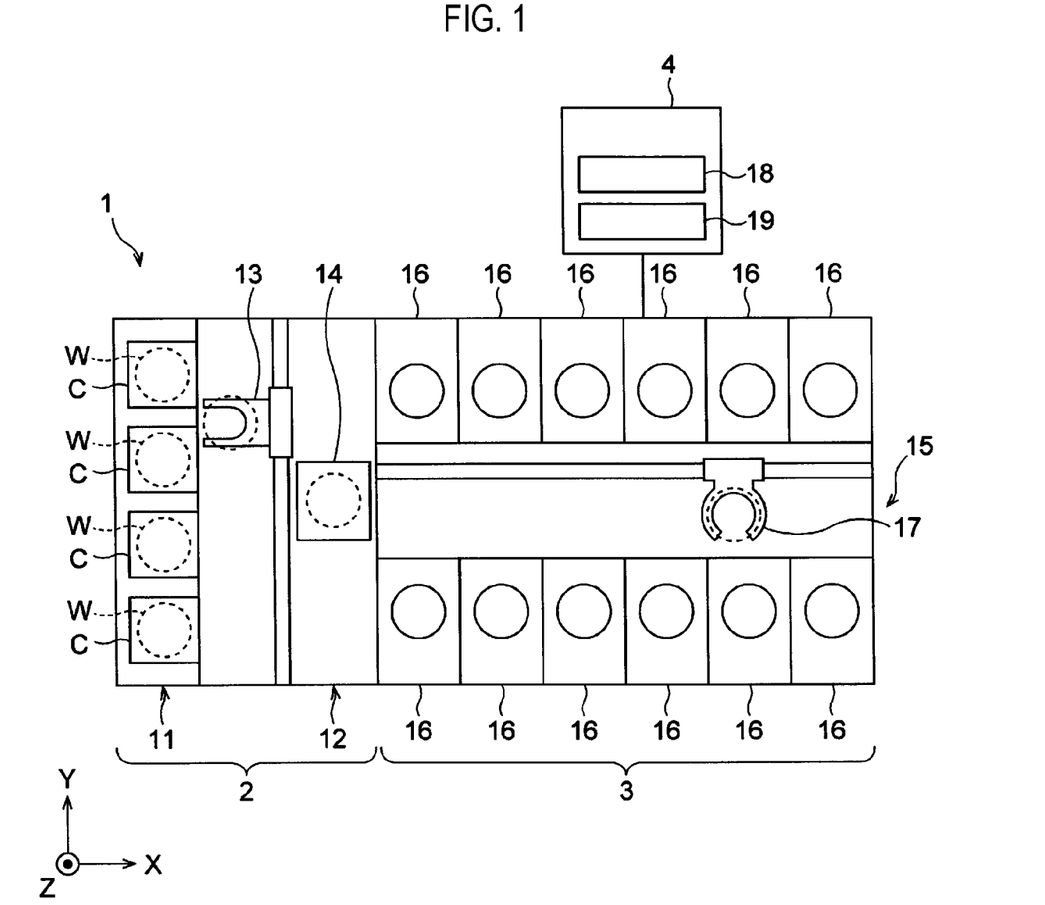
FIG. 1 is a longitudinal sectional view of a substrate processing apparatus according to an embodiment.

FIG. 1 is a view illustrating a schematic configuration of a substrate processing apparatus according to an embodiment. For the clarification of a positional relationship, in the following description, an X-axis direction, a Y-axis direction and a Z-axis direction, which are orthogonal to one another, are defined and a positive Z-axis direction is defined as a vertical upward direction.

As illustrated in FIG. 1, a substrate processing apparatus 1 includes a loading/unloading station 2, and a processing station 3. The loading/unloading station 2 and the processing station 3 are provided adjacent to each other.

The loading/unloading station 2 includes a carrier placement part 11 and a transfer part 12. A plurality of carriers C, each configured to accommodate a plurality of semiconductor wafers W (hereinafter, referred to as "wafers W") in a horizontal posture, are placed in the carrier placement part 11.

The transfer part 12 is provided adjacent to the carrier placement part 11, and includes a substrate transfer device 13 and a delivery part 14. The substrate transfer device 13 includes a wafer holding mechanism configured to hold the wafer W. In addition, the substrate transfer device 13 is movable in the horizontal direction and the vertical direction and is swingable about a vertical axis thereof. The substrate transfer device 13 transfers the wafer W between the carrier C and the delivery part 14 using the wafer holding mechanism.

The processing station 3 is provided adjacent to the transfer part 12. The processing station 3 includes a transfer part 15 and a plurality of processing units 16. The plurality of processing units 16 are arranged on opposite sides of the transfer part 15 in a side-by-side manner.

The transfer part 15 includes a substrate transfer device 17 provided therein. The substrate transfer device 17 includes a wafer holding mechanism configured to hold the wafer W. In addition, the substrate transfer device 17 is movable in the horizontal direction and the vertical direction and is swingable about a vertical axis thereof. The substrate transfer device 17 transfers the wafer W between the delivery part 14 and the processing unit 16 using the wafer holding mechanism.

The processing unit 16 performs a predetermined substrate process on the wafer W transferred by the substrate transfer device 17.

In addition, the substrate processing apparatus 1 includes a control device 4. The control device 4 is, for example, a computer, and includes a controller 18 and a storage 19. The storage 19 stores a program for controlling various kinds of processes executed in the substrate processing apparatus 1. The controller 18 controls the operation of the substrate processing apparatus 1 by reading and executing the program stored in the storage 19.

In addition, such a program may be stored in a non-transitory computer-readable storage medium and may be installed on the storage 19 of the control device 4 from the storage medium. Examples of the computer-readable storage medium may include a hard disc (HD), a flexible disc (FD), a compact disc (CD), a magneto-optical disc (MO), and a memory card.

In the substrate processing apparatus 1 configured as described above, first, the substrate transfer device 13 of the loading/unloading station 2 takes out the wafer W from the carrier C placed on the carrier placement part 11 and places the same on the delivery part 14. The wafer W placed on the delivery part 14 is taken out from the delivery part 14 by the substrate transfer device 17 of the processing station 3, and is loaded into the processing unit 16.

The wafer W loaded into the processing unit 16 is processed by the processing unit 16, and subsequently, unloaded from the processing unit 16 and placed on the delivery part 14 by the substrate transfer device 17. Then, the processed wafer W placed on the deliver part 14 is returned to the carrier C in the carrier placement part 11 by the substrate transfer device 13.

Next, a schematic configuration of each processing unit 16 and an embodiment of a processing liquid supply system (processing liquid supply part) configured to supply a processing liquid to each processing unit 16 will be described with reference to FIGS. 2 to 4.

Figure 2:
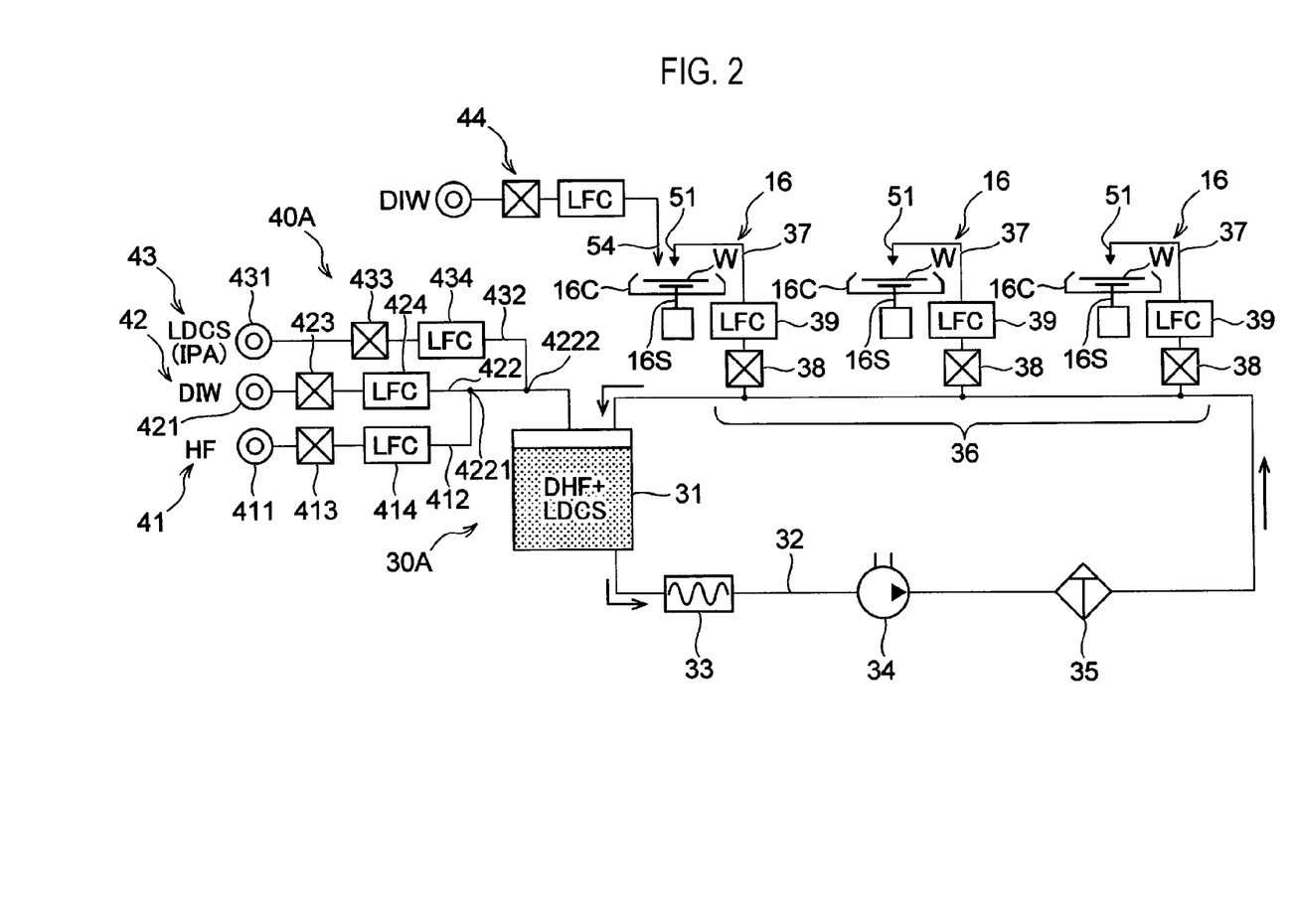
FIG. 2 is a piping system diagram illustrating a first example of a configuration of a processing liquid supply system for supplying a processing liquid to a processing unit, together with a schematic configuration of the processing unit.

As schematically illustrated in FIG. 2, each processing unit 16 has a spin chuck 16S (a substrate holding and rotating mechanism), which is a substrate holding part configured to hold the wafer W in a horizontal posture and rotate the wafer W around a vertical axis thereof. Around the spin chuck 16S, there is provided a liquid receiving cup 16C configured to receive and collect the processing liquid scattering from the wafer W after being supplied to the wafer W. The spin chuck 16S and the liquid receiving cup 16C are accommodated in a processing chamber (housing) which is not illustrated in FIG. 2.

A processing liquid supply system 30A according to a first embodiment illustrated in FIG. 2 has a tank 31 configured to store the processing liquid, and a circulation line 32 that starts from the tank 31 and returns to the tank 31. The tank 31 and the circulation line 32 constitute a circulation system in which the processing liquid circulates. A temperature controller 33, a pump 34, and a filter 35 are sequentially provided in the circulation line 32. The pump 34 forms a circulation flow that starts from the tank 31 and returns to the tank 31 through the circulation line 32. The temperature controller 33 heats or cools down the processing liquid, which passes through the temperature controller 33. The filter 35 removes contaminants such as particles from the processing liquid passing through the filter 35.

At least one branch line 37 is connected to a connection area 36 set in the circulation line 32. At the downstream end of each branch line 37, a nozzle 51 is provided to eject the processing liquid toward the wafer W. Each branch line 37 supplies the processing liquid flowing through the circulation line 32 to a respective processing unit 16. Each branch line 37 is provided with a flow control device. Thus, the processing liquid with a flow rate controlled by the flow control device can be supplied from the nozzle 51 to the wafer W. In FIG. 2, opening/closing valves 38 and liquid flow controllers 39 constituting the flow control devices are illustrated. Each liquid flow controller 39 may be configured with, for example, a combination of a flowmeter and an air-operated valve controlled by an electropneumatic regulator. The configuration of each flow control device may be appropriately modified as needed.

The processing liquid supply system 30A includes a tank liquid supply part 40A configured to supply or replenish a component of the processing liquid to the tank 31.

The tank liquid supply part 40A includes a chemical liquid supply part 41 configured to supply a chemical liquid (e.g., an undiluted liquid) to the tank 31 as a component of the processing liquid, a pure water supply part 42 configured to supply pure water (DIW) as a component of the processing liquid, and a low-dielectric constant solvent supply part 43 configured to supply a low-dielectric constant solvent as a component of the processing liquid.

Any chemical liquid may be used as long as it dissociates by being mixed with DIW to generate an etching factor. In this example, hydrofluoric acid (HF) may be used.

The term "low-dielectric constant solvent" used herein refers to at a solvent having a lower dielectric constant than that of DIW. Specifically, in the accompanying drawings, it is sometimes indicated as LDCS (low-dielectric constant solvent) for simplicity. As the low-dielectric constant solvent, any solvent may be used as long as it is compatible with DIW and has a lower dielectric constant than that of DIW. A relative dielectric constant of the low-dielectric constant solvent may be ½ or less of that of DIW. In this example, it is assumed that IPA (isopropyl alcohol), which has a relative dielectric constant of about ¼ of that of DIW at normal temperature, is used as the low-dielectric constant solvent.

The chemical liquid supply part 41 has a chemical liquid line 412 (a pipe) connected to a chemical liquid source 411, and a flow control device provided in the chemical liquid line 412. In FIG. 2, an opening/closing valve 413 and a liquid flow controller 414 are illustrated to constitute the flow control device.

The pure water supply part 42 has a pure water line 422 (a pipe) connected to a pure water source 421, and a flow control device provided in the pure water line 422. In FIG. 2, an opening/closing valve 423 and a liquid flow controller 424 are illustrated to constitute the flow control device.

The low-dielectric constant solvent supply part 43 has a low-dielectric constant solvent supply line 432 (a pipe) connected to a low-dielectric constant solvent source 431, and a flow control device provided in the low-dielectric constant solvent line 432. In FIG. 2, an opening/closing valve 433 and a liquid flow controller 434 are illustrated to constitute the flow control device.

A configuration of each of the liquid flow controllers 414, 424, and 434 may be the same as that of the liquid flow controller 39 described above. The configuration of the flow control device of each of the supply parts 41, 42, and 43 may be appropriately modified as needed. Each of the sources 411, 421, and 431 may be a factory power of a semiconductor device manufacturing factory in which a substrate processing apparatus is installed, or may be a liquid storage part such as a tank provided in the substrate processing apparatus. In the embodiment of FIG. 2, since the components of the processing liquid may be supplied to each processing part 16 after being mixed in the tank 31, the flow control device of each of the supply parts 41, 42, and 43 only need to have a function of quantifying each liquid.

In the first embodiment illustrated in FIG. 2, the pure water line 422 is provided as a main line. The chemical liquid line 412 is joined with the pure water line 422 at a first junction portion (first mixing portion) 4221 set on the pure water line 422. At a second merging portion (second mixing portion) 4222 set on the downstream side of the first junction 4221 of the pure water line 422, the low-dielectric constant solvent line 432 is joined with the pure water line 422. In order to promote the mixing of the pure water, the chemical liquid, and the low-dielectric constant solvent, an in-line mixer may be provided in the pure water line 422, for example, at the second merging portion 4222 or on the downstream side thereof.

According to the first embodiment, it is possible to perform a processing using the processing liquid having a stable concentration (a mixing ratio).

Figure 3:
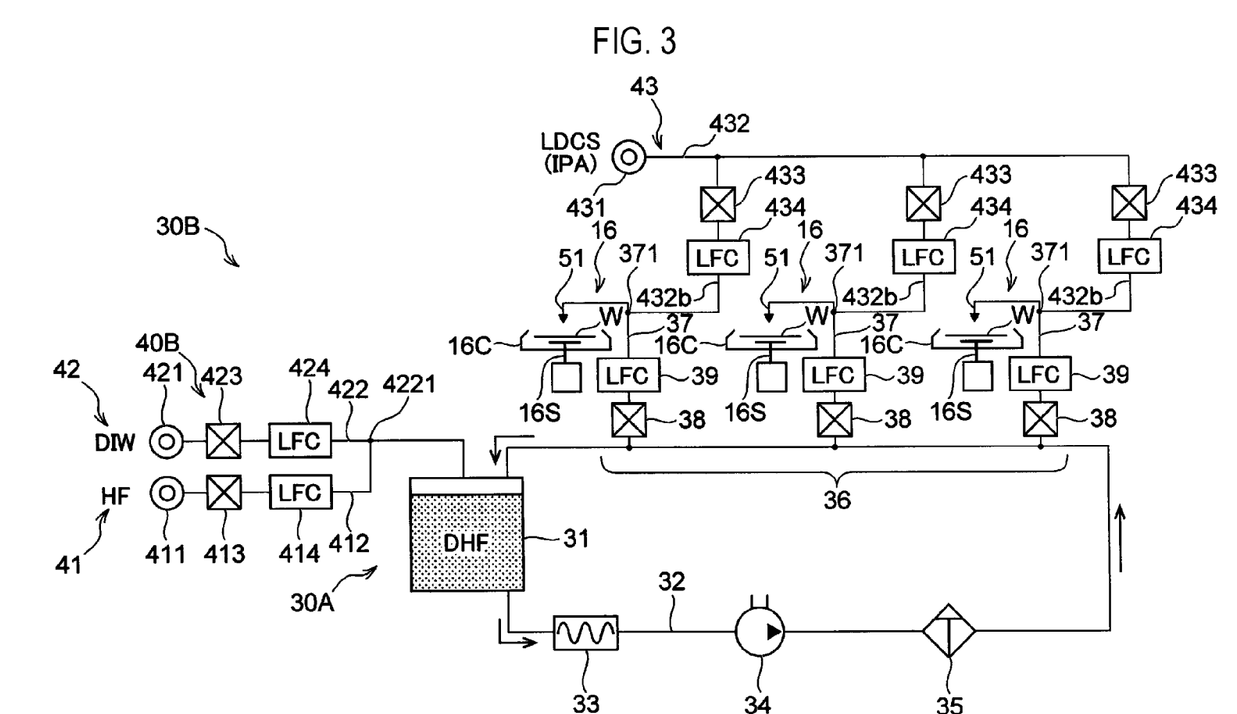
FIG. 3 is a piping system diagram illustrating a second example of the configuration of the processing liquid supply system for supplying the processing liquid to the processing unit together with the schematic configuration of the processing unit.

A processing liquid supply system 30B according to a second embodiment illustrated in FIG. 3 is different from the processing liquid supply system 30A according to the first embodiment only in that a tank liquid supply part 40B does not have the low-dielectric constant solvent supply part 43 and the low-dielectric constant solvent is supplied to branch lines 37. In FIG. 3, the same components as those illustrated in FIG. 2 will be denoted by the same reference numerals, and redundant descriptions thereof will be omitted.

The low-dielectric constant solvent supply part 43 of the processing liquid supply system 30B according to the second embodiment includes the low-dielectric constant solvent line (main line) 432 (a pipe) connected to the low-dielectric constant solvent source 431, and a plurality of branch lines (low-dielectric constant solvent branch lines) 432b branched from the low-dielectric constant solvent line 432. The flow control device (combination of the opening/closing valve 433 and the liquid flow controller 434) is provided in each branch line 432b. One end of the branch line 432b is joined in a junction portion 371 set on the downstream side of the flow control device (combination of the opening/closing valve 38 and the liquid flow controller 39) of each branch line 37.

In the second embodiment, the tank liquid supply part 40B supplies a diluted chemical liquid (e.g., diluted hydrofluoric acid (DHF) in this example), which is obtained by mixing the pure water and the chemical liquid at a controlled mixing ratio, to the tank 31. The diluted chemical liquid flows into each branch line 37 through the circulation line 32. The diluted chemical liquid, the flow rate of which is controlled by the flow control device (combination of the opening/closing valve 38 and the liquid flow controller 39) provided in each branch line 37, and the low-dielectric constant solvent, the flow rate of which is controlled by the flow control device (combination of the opening/closing valve 423 and the liquid flow controller 434) provided in each branch line 432b, are mixed at each junction portion (second mixing portion) 371, thereby generating the processing liquid. The processing liquid is ejected from each nozzle 51 toward the wafer W. An in-line mixer may be provided at the junction portion 371 of each branch line 37 or on a downstream side of the junction portion 371 in order to promote the mixing of the diluted chemical liquid and the low-dielectric constant solvent.

In the second embodiment, it is easy to flexibly adjust the content of the diluted chemical liquid in the processing liquid.

Figure 4:
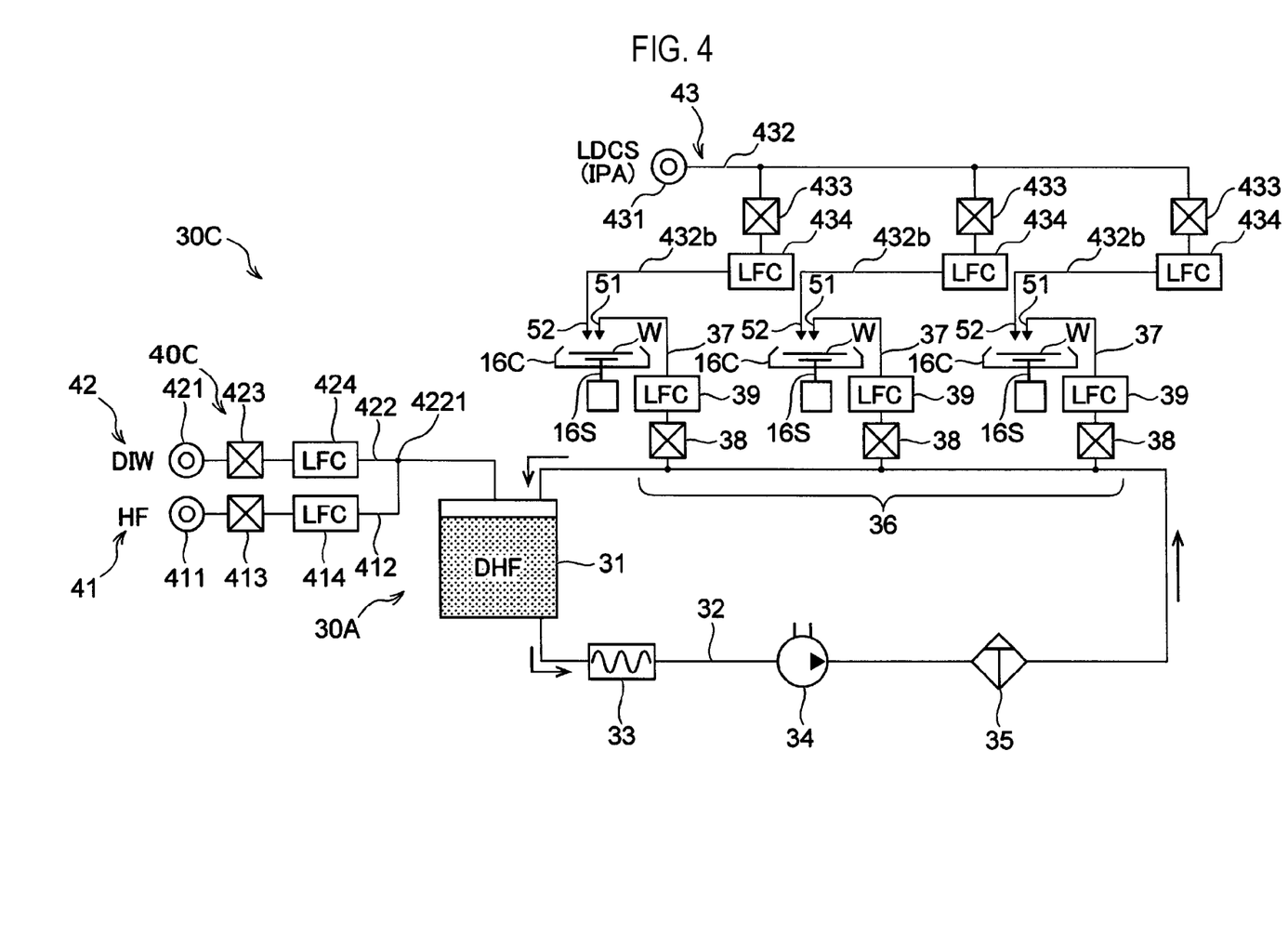
FIG. 4 is a piping system diagram illustrating a third example of the configuration of the processing liquid supply system for supplying the processing liquid to the processing unit, together with the schematic configuration of the processing unit.

A processing liquid supply system 30C according to a third embodiment illustrated in FIG. 4 is different from that of the second embodiment only in that the diluted chemical liquid (DHF in this example) and a low-dielectric constant solvent are supplied to the front surface of the wafer W by separate nozzles 51 and 52, respectively. In FIG. 3, the same components as those illustrated in FIGS. 1 and 2 will be denoted by the same reference numerals, and redundant descriptions thereof will be omitted.

In the third embodiment, each branch line (low-dielectric constant solvent branch line) 432b is not joined with each branch line 37. The nozzle 52 is provided at the tip of each branch line 432b. That is, in the third embodiment, the diluted chemical liquid is ejected onto the wafer W at a controlled flow rate from the nozzle 51, and the low-dielectric constant solvent is ejected onto the wafer W at a controlled flow rate from the nozzle 52. Thus, the diluted chemical liquid and the low-dielectric constant solvent are mixed with each other on the front surface of the wafer W, thus generating the processing liquid. A tank liquid supply part 40C of the third embodiment is the same as the tank liquid supply part 40B of the second embodiment.

In the third embodiment, it is easy to flexibly adjust the content of the diluted chemical liquid in the processing liquid. In addition, the number of nozzles used in a series of liquid processing steps (including a rinsing step and a drying step) may be reduced.

Next, a wet etching of a film formed on the wafer W, which is a liquid processing performed using the substrate processing apparatus 1 illustrated in FIGS. 1 to 4, will be described. The liquid processing is executed by controlling various operable components of the substrate processing apparatus 1 (e.g., the chemical liquid supply part, the pure water supply part, the flow control device of the low-dielectric constant solvent supply part, the spin chuck and the like) by the control device 4.

Figures 5A, 5B:
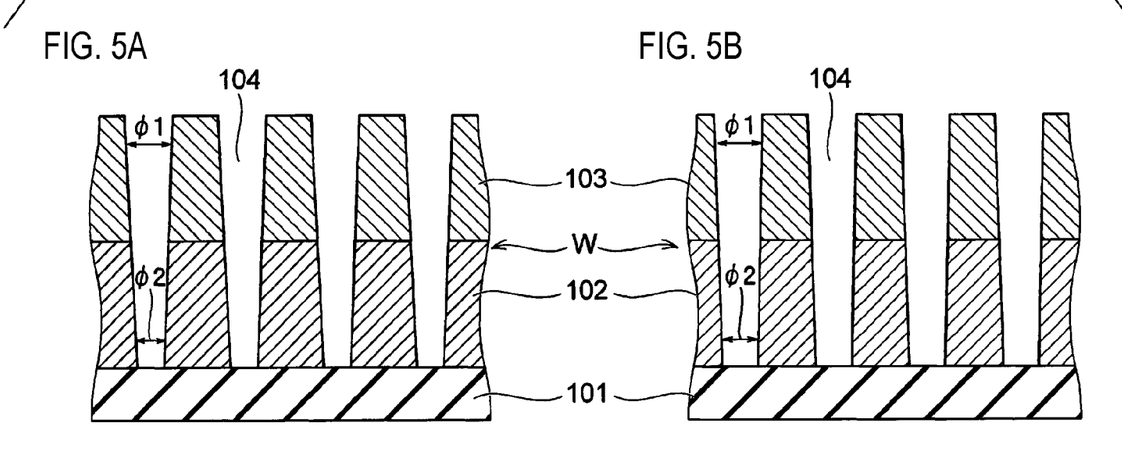
FIGS. 5A and 5B are cross-sectional views illustrating an example of a film formed on a wafer.

FIGS. 5A and 5B are schematic cross-sectional views each illustrating an example of a configuration of a laminated film formed on the wafer W, which is a substrate to be processed. A boron phosphor silicate glass (BPSG) film 102 and a thermal oxide film 103 are formed on an underlying layer 101. The underlying layer 101 is, for example, a polysilicon film or a tungsten film. The BPSG film 102 may be a boron silicate glass (BSG) film or a phosphor silicate glass (PSG) film. The thermal oxide film 103 may be an oxide film formed through a CVD method. In addition, a SiN film (not illustrated) may be interposed between the layers.

Deep holes 104 penetrating the laminated film in the thickness direction are formed through dry etching. Each deep hole formed through the dry etching has a relatively wide hole diameter $\phi 1$ at the entrance side and a relatively narrow hole diameter $\phi 2$ at the inner side (see FIG. 5A). In the hole diameter of each deep hole 104, for the purpose of making a difference between the hole diameter $\phi 1$ and the hole diameter $\phi 2$ as small as possible (see FIG. 5B), the wet etching is performed using diluted hydrofluoric acid (DHF). For this purpose, an etching rate of the BPSG film 102 should be higher than that of the thermal oxide film 103.

The equilibrium state of HF in an aqueous HF solution is as follows.

$$HF \Leftrightarrow H^+ + F^-$$

$$HF + H_2O \Leftrightarrow H_3O^+ + F^-$$

$$HF + F^- \Leftrightarrow HF_2^-$$

$HF_2^-$ is an etching factor for both the thermal oxide film and the BPSG film. Non-dissociable HF is an etching factor for the BPSG film. Accordingly, it is possible to increase the etching selectivity of the BPSG film 102 relative to the thermal oxide film 103 (etching selectivity (BPSG/TEOS)) by increasing the amount of non-dissociable HF in the processing liquid. In order to increase the amount of non-dissociable HF, the concentration of HF in DHF may be increased. However, there is a limit in improving the etching selectivity of the BPSG film 102 by this method.

Solvation occurs in a solvent having a high dielectric constant (large polarization) such as DIW, and HF may take an ionic state such as $F^-$ or $HF_2^-$. In contrast, in a solvent having a low dielectric constant (small polarization), no solvation occurs, and HF is in a non-dissociable state. In the present embodiment, using this phenomenon, the amount of non-dissociable HF is increased by adding a low-dielectric constant solvent to HF or DHF, and the etching selectivity of the BPSG film 102 relative to the thermal oxide film 103 is increased.

In addition, this holds true in the case where the BPSG film is a PSG film or a BSG film, and the case where the thermal oxide film is an oxide film formed through a CVD method.

<Operation in First and Second Embodiments>

Hereinafter, description will be given of a series of liquid processing steps performed on the wafer W using the processing liquid supply system 30A according to the first embodiment illustrated in FIG. 2 or the processing liquid supply system 30B according to the second embodiment illustrated in FIG. 3.

[Substrate Loading Step]

The wafer W having the laminated film structures illustrated in FIGS. 5A and 5B is loaded into the processing unit 16 by the substrate transfer device 17 (see FIG. 1), and is held by the spin chuck 16S.

[Chemical Liquid Processing Step]

The spin chuck 16S rotates the wafer W around the vertical axis at a predetermined rotation speed. The rotation of the wafer W is continued until the series of liquid processes on the wafer W are terminated. The rotation speed of the wafer W is changed as needed.

The nozzle 51 held by a nozzle arm (not illustrated) is located above the wafer W. The processing liquid (mixed processing liquid) composed of the pure water, the chemical liquid, and the low-dielectric constant solvent mixed at a predetermined mixing ratio is ejected from the nozzle 51 toward the center of the rotating wafer W. The film formed on the wafer W is etched by the processing liquid.

It is possible to adjust the etching selectivity of the BPSG film 102 relative to the thermal oxide film 103 to a preferable value by using a processing liquid having a proper mixing ratio of pure water, a chemical liquid, and a low-dielectric constant solvent, which is obtained in advance through a test. As a result, it is possible to make the target hole diameters of the deep holes 104 uniform.

[Rinsing Step]

After the chemical liquid processing step is performed for a predetermined time, the supply of the processing liquid from the nozzle 51 is stopped, and a rinsing liquid such as DIW is supplied to the wafer W from a separate nozzle 54. With this rinsing liquid, the processing liquid used in the chemical liquid processing step and produced reaction products are washed away. For simplification of the drawing, the nozzle 54 and a separate pure water supply part 44 for supplying DIW to the nozzle 54 are shown only in the leftmost processing unit 16 in FIG. 2.

[Drying Step]

After the rinsing step is performed for a predetermined time, the supply of the rinsing liquid from the nozzle 54 is stopped while the wafer W is continuously rotated (preferably, the rotation speed is increased), and shake-off drying of the wafer W is performed. Before the shake-off drying, a drying liquid, for example, IPA, may be supplied to the wafer W from a separate nozzle (a nozzle similar to the nozzle 54), and the DIW on the wafer W may be replaced with the IPA. The drying method is not limited to the above. After replacing the DIW on the wafer W with the IPA, supercritical drying may be performed in another processing unit instead of performing the shake-off drying.

[Substrate Unloading Step]

After the drying step is completed, the substrate transfer device 17 receives the wafer W from the spin chuck 16S and unloads the same out of the processing unit 16.

In addition, as schematically illustrated in FIG. 2, the above-mentioned "separate nozzle" (54 or the like) is connected to a liquid source (a rinsing liquid source, a drying liquid source, or the like). Thus, the liquid (rinsing liquid or drying liquid) flows to the "separate nozzle" and is supplied at a controlled flow rate through a liquid line provided with a flow control device. The rinsing liquid may be supplied from the nozzle 51 without using the above-mentioned "separate nozzle". In this case, the rinsing liquid line connected to the rinsing liquid source and provided with the flow control device is connected to the branch line 37 on the downstream side of the flow control device (combination of the opening/closing valve 38 and the liquid flow controller 39) (in the case of the embodiment of FIG. 2), or connected to the downstream side of the junction portion 371 (in the case of the embodiment of FIG. 3).

<Operation in Third Embodiment>

Next, a series of liquid processing steps performed on the wafer W using the processing liquid supply system 30C according to the third embodiment illustrated in FIG. 4 will be described. Even in this case, the wafer W continues to rotate from the start of processing to the end of processing. The substrate loading step, the rinsing step, the drying step, and the substrate unloading step are the same as those in the first and second embodiments, and a description thereof will be omitted. In the following description, DIW supplied as a pre-wetting liquid and DIW supplied as a rinsing liquid are supplied from the nozzle 51 for supplying DHF. In this case, a pure water line connected to a pure water source and provided with a flow control device is connected to the branch line 37 on the downstream side of the liquid flow controller 39.

[Pre-Wetting Step]

The spin chuck 16S rotates the wafer W at a predetermined rotation speed (e.g., about 1,000 rpm) while holding the wafer W. The rotation speed of the wafer W is maintained at about 1,000 rpm until the drying step is started (however, it may be changed).

The nozzle 51 held by a nozzle arm (not illustrated) is located directly above the center of the wafer W. DIW is supplied from the nozzle 51 to the center of the wafer W (e.g., at an ejection flow rate of about 1,500 ml/min for about 6 to 7 seconds), and the front surface of the wafer W (including the inner surfaces of the concave portions of the pattern) is covered with a liquid film of DIW (see FIG. 6A).

Subsequently, the nozzle 51 is moved to a position slightly shifted from directly above the center of the wafer W, and the nozzle 52 held by a nozzle arm (not illustrated) is disposed at a position slightly shifted from directly above the center of the wafer W. As a result, the midpoint between the nozzle 51 and the nozzle 52 is positioned almost directly above the center of the wafer W. The ejection flow rate of the DIW from the nozzle 51 is reduced to about 700 ml/min, and IPA (which is also a low-dielectric constant solvent) as a pre-wetting liquid is supplied from the nozzle 52 to the center of the wafer W (e.g., at an ejection flow rate of about 300 ml/min). This state is maintained for about 9 to 10 seconds, for example, so that the front surface of the wafer W is covered with a liquid film of a mixed liquid of DIW and IPA (see FIG. 6B).

Subsequently, the nozzle 52 is moved to a position directly above the center of the wafer W, and the nozzle 51 is moved to a position further shifted from directly above the center of the wafer W. In this state, the ejection of the DIW from the nozzle 51 is stopped while the ejection of the IPA from the nozzle 52 is continued. This state is maintained for, for example, about 4 to 5 seconds so that the front surface of the wafer W is covered with the liquid film of IPA (see FIG. 6C). In this manner, the pre-wetting step is completed.

The pre-wetting step is effective in promoting the removal of dry etching polymer formed during the dry etching for forming the deep holes 104 and adhering to the inner surfaces of the deep holes 104. By causing the IPA to be infiltrated between the dry etching polymer and the underlying film, it is possible to efficiently remove the dry etching polymer and the underlying film by the chemical liquid used in a next step. In some embodiments, the above-described pre-wetting step may be performed before the chemical liquid processing step in the operation in the first and second embodiments described above.

[Chemical Liquid Processing Step (First Chemical Liquid Processing Step)]

Subsequently, the nozzle 51 and the nozzle 52 are moved such that the midpoint between the nozzle 51 and the nozzle 52 is located almost directly above the center of the wafer W. In this state, the ejection flow rate of the IPA from the nozzle 52 is reduced to, for example, about 300 ml/min, and DHF is supplied from the nozzle 51 to the center of the wafer W (e.g., at an ejection flow rate of about 700 ml/min). This state is maintained for, for example, about 3 seconds, such that the front surface of the wafer W is covered with a liquid film of a mixed liquid of DHF and IPA (see FIG. 6D). That is, in this embodiment, IPA, which is a low-dielectric constant solvent, is mixed with DHF after being supplied to the wafer W, and a processing liquid including pure water, a chemical liquid (HF), and a low-dielectric constant solvent is generated. The ejection flow rate of the DHF from the nozzle 51 and the ejection flow rate of the IPA from the nozzle 52 are controlled to have values, obtained in advance through tests, at which an appropriate mixing ratio of pure water, a chemical liquid, and a low-dielectric constant solvent is obtained.

[Chemical Liquid Processing Step (Second Chemical Liquid Processing Step)]

Subsequently, the nozzle 51 is moved to a position directly above the center of the wafer W, and the nozzle 52 is moved to a position further shifted from directly above the center of the wafer W. In this state, the ejection of the IPA from the nozzle 52 is stopped while the ejection of the DHF from the nozzle 51 is maintained (e.g., at an ejection flow rate of about 1,500 ml/min). This state is maintained for, for example, about 3 seconds, such that the front surface of the wafer W is covered with the liquid film of DHF (see FIG. 6E).

In the second chemical liquid processing step, it is possible to make the etching rates of the thermal oxide film 103 and the BPSG film 102 close to or substantially identical to each other. This second chemical liquid processing step is not limited to completely stopping the ejection of the IPA as a low-dielectric constant solvent from the nozzle 52. The ratio between the ejection flow rate of the DHF from the nozzle 51 and the ejection flow rate of the IPA from the nozzle 52 may be changed so as to change the etching rate ratio between the thermal oxide film 103 and the BPSG film 102.

[Rinsing Step]

Figure 6A:
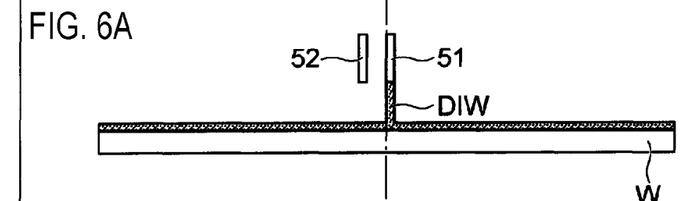
FIGS. 6A to 6E are explanatory views illustrating an example of a procedure of liquid processing.
Figure 6B:
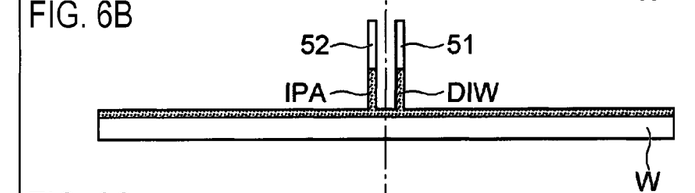
Figure 6C:
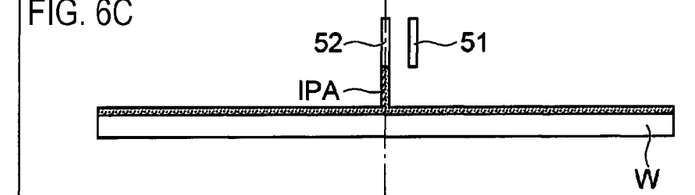
Figure 6D:
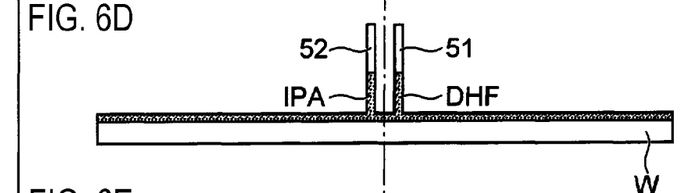
Figure 6E:
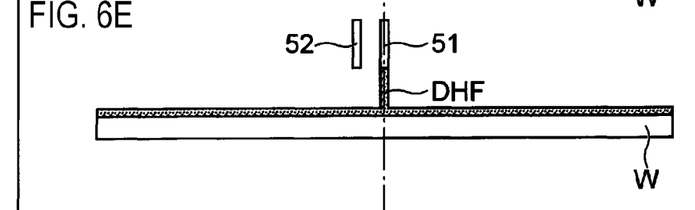

After the above-described chemical liquid processing step is performed for a predetermined time, it is possible to perform a rinsing step by stopping the ejection of the DHF from the nozzle 51 and the ejection of the IPA from the nozzle 52 and ejecting DIW from the nozzle 51 located directly above the center of the wafer W (see FIG. 6A).

After the rinsing step is completed, it is possible to perform the above-described drying step and substrate unloading step. In the drying step, the DIW on the wafer W may be replaced with IPA by executing the procedures of FIGS. 6B and 6C prior to the shake-off drying. In this case, since the drying liquid (solvent having higher volatility and lower surface tension than DIW) used in the drying step and the low-dielectric constant solvent used in the chemical liquid processing step are the same IPA, it is possible to reduce the number of nozzles and flow control devices provided in the processing units 16.

According to the above embodiments, it is possible to adjust the ratio of the etching rates of the plurality of films by adjusting the content of the low-dielectric constant solvent.

In the above embodiments, HF (hydrofluoric acid) is used as a chemical liquid (a chemical liquid component) that dissociates when mixed with pure water, and IPA is used as a low-dielectric constant solvent that suppresses the dissociation of the chemical liquid component. However, the present disclosure is not limited thereto. In the above embodiments, the chemical liquid and the film to be etched may be of any type as long as the degree of dissociation of a chemical liquid component changes depending on the mixing ratio of a chemical liquid, pure water and a low-dielectric constant solvent, so that an etching selectivity between two or more types of etching target films changes. The chemical liquid contained in the processing liquid is not limited to the case of only one type (only HF) as in the above-described embodiments, but may be one containing plural types of chemical liquid components, for example, SC1 (containing ammonium hydroxide and hydrogen peroxide as the chemical liquid components).

In a specific example, the processing liquid may be a mixed liquid of 49% HF as a chemical liquid, DIW (pure water), and IPA as a low-dielectric constant solvent. In the mixed liquid, a ratio of HF:(DIW+IPA) is from 1:100 to 1:1,000, and a ratio of DIW:IPA is in the range of about 0:1 to 1:2. The film to be etched by such a mixed solution is not limited to the above-described thermal oxide film and BPSG film. The films to be etched may be composed of a plurality of films including a BPSG film, and may be a SiN (nitride) film, a polysilicon film, or a tungsten film, instead of the thermal oxide film.

As the low-dielectric constant solvent, a solvent having a lower dielectric constant than DIW may be used. Specifically, as the low-dielectric constant solvent, for example, ethanol, methanol, acetone, ethylene glycol, propylene glycol, cyclohexane, PGMA, PGMEA, acetic acid, butyl acetate, t-pentanol and the like may also be used, in addition to IPA.

In the above embodiments, the substrate to be processed is a semiconductor wafer, but is not limited thereto. The substrate may be any type of substrate used in the semiconductor device manufacturing field, such as a glass substrate, a ceramic substrate and the like.

According to the present disclosure in some embodiments, it is possible to adjust an etching selectivity of a plurality of films formed on a substrate.

It should be noted that the embodiments disclosed herein are exemplary in all respects and are not restrictive. The above-described embodiments may be omitted, replaced or modified in various forms without departing from the scope and spirit of the appended claims.

What is claimed is:

1. A method performed by a substrate processing apparatus that comprises:
    a substrate holder configured to hold a substrate;
    a chemical liquid supply configured to supply a chemical liquid;
    a pure water supply configured to supply pure water;
    a low-dielectric constant solvent supply configured to supply a low-dielectric constant solvent;
    a processing liquid supply configured to supply a processing liquid to the substrate held by the substrate holder, wherein the processing liquid supply includes:
        a first mixer configured to mix the chemical liquid supplied from the chemical liquid supply with the pure water supplied from the pure water supply so as to generate a pure water-diluted chemical liquid;
        a tank configured to store the pure water-diluted chemical liquid generated by the first mixer;
        a circulation line through which the pure water-diluted chemical liquid flows, starting from the tank and returning to the tank;
        a second mixer configured to mix the pure water-diluted chemical liquid from the circulation line with the low-dielectric constant solvent supplied from the low-dielectric constant solvent supply so as to generate the processing liquid; and
        a nozzle configured to eject the processing liquid generated by the second mixer to the substrate held by the substrate holder; and
    a controller configured to control a ratio of the chemical liquid, the pure water, and the low-dielectric constant solvent contained in the processing liquid by controlling the chemical liquid supply, the pure water supply, the low-dielectric constant solvent supply,
    wherein the method comprises:
    etching a film formed on the substrate by supplying the substrate with the processing liquid obtained by mixing the chemical liquid, the pure water, and the low-dielectric constant solvent.

2. The method of claim 1, further comprising: supplying a rinsing liquid to the substrate, after the etching the film.

3. The method of claim 1, wherein, in the etching the film, the chemical liquid, the pure water, and the low-dielectric constant solvent are mixed, and subsequently, ejected from the nozzle to the substrate as the processing liquid.

4. The method of claim 1, wherein the etching the film includes:
    generating the pure water-diluted chemical liquid by mixing the chemical liquid supplied from the chemical liquid supply with the pure water supplied from the pure water supply;
    generating the processing liquid by mixing the pure water-diluted chemical liquid with the low-dielectric constant solvent supplied from the low-dielectric constant solvent supply; and
    ejecting the processing liquid to the substrate from the nozzle.

5. The method of claim 1, further comprising: adjusting a content of the low-dielectric constant solvent in the processing liquid so as to adjust an etching rate of the film or an etching selectivity of the film relative to another film.

* * * * *